United States Patent [19]
Barnett et al.

[11] Patent Number: 5,144,377
[45] Date of Patent: Sep. 1, 1992

[54] HIGH-SPEED HETEROJUNCTION LIGHT-EMITTING DIODE

[75] Inventors: Allen M. Barnett, Newark, Del.; John B. Berryhill, Logan, Utah

[73] Assignee: University of Delaware, Newark, Del.

[21] Appl. No.: 680,378

[22] Filed: Apr. 4, 1991

[51] Int. Cl.⁵ .......................................... H01L 33/00
[52] U.S. Cl. .......................................... 357/17; 357/16; 357/55; 357/56
[58] Field of Search ........................ 357/17, 16, 55, 56

[56] References Cited

FOREIGN PATENT DOCUMENTS

| | | |
|---|---|---|
| 56-30775 | 3/1981 | Japan .................................. 357/17 X |
| 56-69880 | 6/1981 | Japan .................................. 357/17 X |
| 57-30385 | 2/1982 | Japan .................................. 357/17 X |
| 1-179388 | 7/1989 | Japan .................................. 357/17 X |
| 1-185988 | 7/1989 | Japan .................................. 357/17 X |

*Primary Examiner*—William Mintel
*Attorney, Agent, or Firm*—Connolly & Hutz

[57] ABSTRACT

A high-speed heterojunction light-emitting diode is formed by providing a dielectric layer on a heavily doped semiconductor substrate having short minority carrier lifetime. A semiconductor layer of opposite conductivity to the substrate is epitaxially grown through vias in the dielectric layer. This results in a junction area equal to the useful light-emitting area. An electrical contact is formed on the laterally overgrown area of the epitaxially grown material. The diode manufacture is compatible with planar processing techniques commonly used in integrated circuit manufacture.

17 Claims, 2 Drawing Sheets

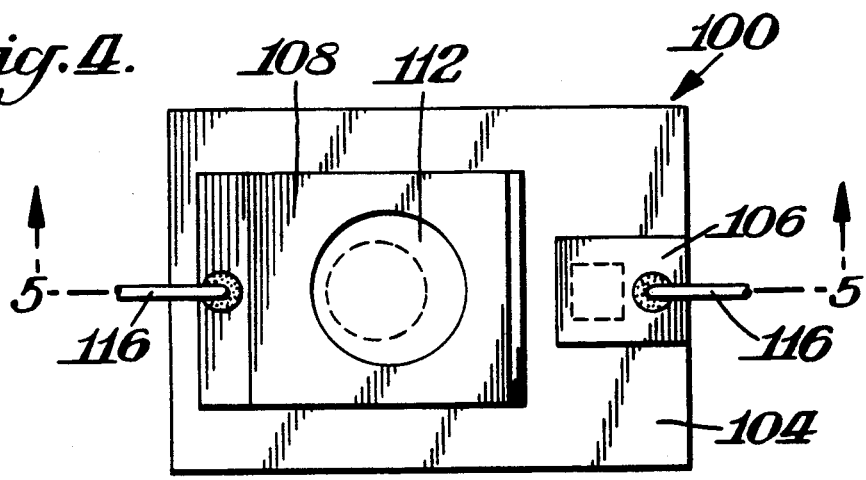
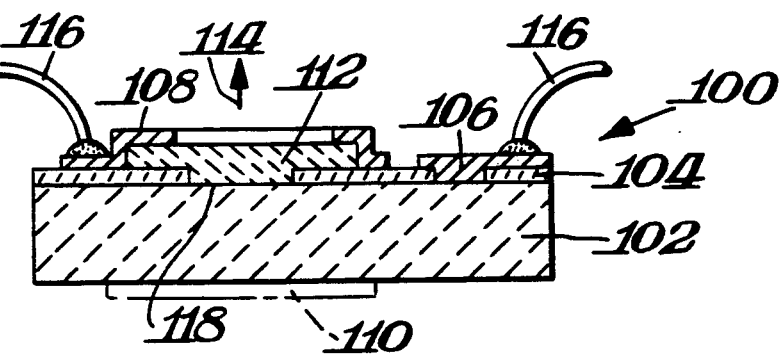
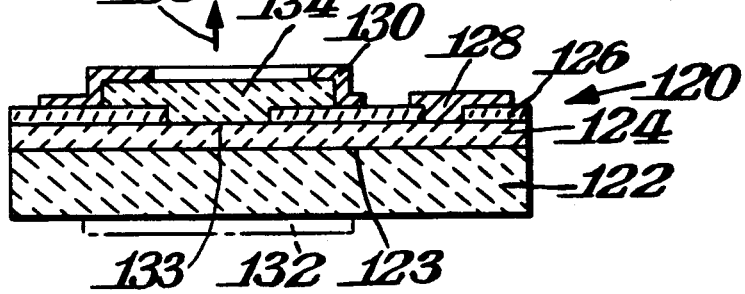

HIGH-SPEED HETEROJUNCTION LIGHT-EMITTING DIODE

BACKGROUND OF INVENTION

The use of GaAs on Si technology for the optical interconnection of integrated circuits has been suggested by a number of authors. Such an application would require the use of high-speed LED's with a quasi-planar structure fabricated at selected sites upon the GaAs:Si wafer. These LED's should be capable of operation in excess of 500 MHz.

The typical surface-emitting LED's are the Burrus diode and the mesa diode. A main drawback with the Burrus LED is that it has a larger junction area than its light-emitting area. This tends to introduce a parasitic capacitance which ultimately limits the useful operating speed of the device. With the mesa diode, the junction area is larger than the useful area due to the fact that the electrical contact blocks the light from as much as one third of the junction area. Moreover, the exposed edge of the mesa diode does not allow for making contact with other devices on the same substrate.

SUMMARY OF THE INVENTION

An object of this invention is to provide a high-speed heterojunction LED which overcomes the deficiencies of the Burrus and mesa diodes.

A further object of this invention is to provide such a LED which may be produced by techniques compatible with planar processing techniques commonly used in integrated circuit manufacture.

In accordance with this invention, the high-speed heterojunction LED is particularly suitable for optical interconnection of GaAs:Si integrated circuits. The LED is produced by providing a dielectric layer on a heavily doped semiconductor substrate having short minority carrier lifetime. A semiconductor layer of opposite conductivity to the substrate is formed by epitaxial growth through vias in the dielectric layer. An electrical contact is made on laterally overgrown material.

If desired, the LED may also be of a dual-junction type wherein a semiconductor layer of opposite conductivity to the substrate is grown on the substrate and a further semiconductor layer of the same conductivity as the substrate is then grown through vias in the dielectric layer.

THE DRAWINGS

FIG. 1 schematically illustrates in cross-section a prior art LED Burrus diode;

FIG. 4 is a top plan view of an LED in accordance with this invention;

FIG. 5 is a cross-sectional view taken through FIG. 4 along the line 5—5; and

FIG. 6 is a cross-sectional view similar to FIG. 5 illustrating a dual-junction LED in accordance with this invention.

DETAILED DESCRIPTION

Figure 1:
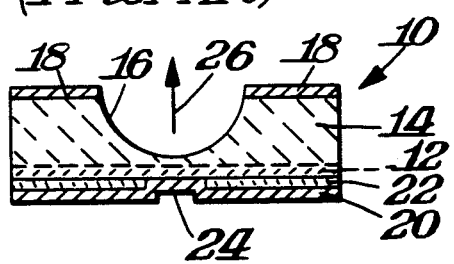
Figure 2:
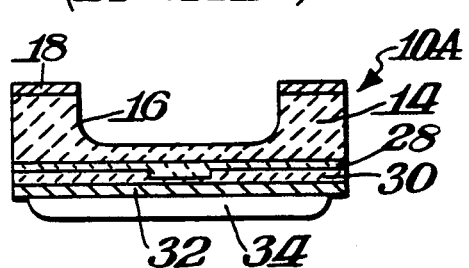
FIG. 2 illustrates a further prior art variation of the Burrus diode shown in FIG. 1.
Figure 3:
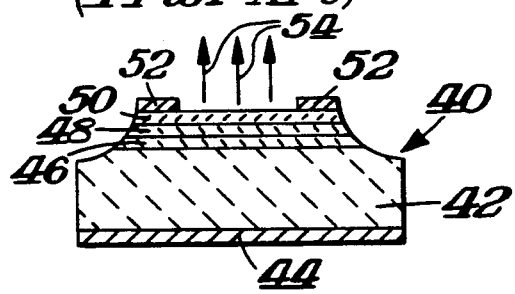
FIG. 3 illustrates in cross-section a prior art mesa diode.

FIGS. 1–2 illustrate variations of a prior art Burrus diode while FIG. 3 illustrates a prior art mesa diode. As shown therein, the Burrus diode 10 of FIG. 1 is made by growing a p-type layer 12 onto an n-type substrate 14, applying a contact 18, preferably a metal contact, of limited area to the front of the wafer and etching an opening 16 into the substrate 14 to allow light 26 to be extracted. The diode 10 shown in FIG. 1 also includes a metal contact layer 20 and a layer 22 of, for example, $SiO_2$ with an opening section 24 being provided in metal contact 20 having a dimension of, for example, 50 μm.

Efficiency of Burrus diodes can be enhanced in the manner shown in FIG. 2 by the growth of one or more layers 28 of AlGaAs in order to decrease light absorption and increase electron injection efficiency. With the diode 10A shown in FIG. 2, the substrate 14 would again have a metal contact layer 18 and an etched opening 16 as in FIG. 1. Diode 10A would also include proton bombarded layer 30 and p-GaAs active area 32 above heat sink 34.

FIG. 3 illustrates a prior art mesa structure 40 which is an attempt to overcome the parasitic capacitance problem of the Burrus LED's 10, 10A. In the structure 40, layers forming the junction are grown and sequentially etched to form an elevated area upon the substrate. Contact is then made to the periphery of the mesa structure. As shown in FIG. 3, the structure 40 includes a substrate 42 made, for example, of n-GaAs with a contact 44 being formed on one side thereof and with a layer 46 of, for example, n-GaAs, a layer 48 of n-$Al_{0.4}Ga_{0.6}As$ and layer 50 of p-GaAs with reference numeral 52 indicating the top contact. Light is shown by the arrows 54.

FIGS. 4–5 illustrate one embodiment of this invention which overcomes the problems of the Burrus diode and the mesa diode. As shown therein, the LED 100 includes a substrate 102 made from a heavily doped semiconductor material having short minority carrier lifetime such as 10 or less nanoseconds. In a preferred practice of the invention, substrate 102 could be made from p-GaAs or p-GaAs on Si. A dielectric 104 is formed on substrate 102. In accordance with this invention, a further or top semiconductor layer 112 is epitaxially grown through vias in dielectric 104 on substrate 102. Semiconductor layer 112 is of opposite conductivity than substrate 102. In a preferred practice of this invention, semiconductor layer 112 would be made of n-AlGaAs compound. An anode or metal contact 106 is formed on the dielectric through vias in the dielectric 104. A further metal contact or cathode 108 is formed on dielectric 104 and part of the overgrown area of 112. Optionally, the anode may be a metal contact 110 on the back surface of substrate 102. The anode is preferably made from a gold-zinc alloy while the cathode is preferably made from Au-Ge-Ni alloy. Substrate 102 could be p-GaAs or GaAs on Si. FIG. 5 also illustrates by reference numeral 114 the direction of the light. As further shown in FIG. 5, the wiring is indicated by the reference numeral 116. A junction 118 is formed between semiconductor layers 102 and 112.

The LED 100 fulfills the design requirements for optical interconnection. The capacitance limitations of Burrus and mesa structures are reduced by liquid-phase heteroepitaxial growth through the dielectric vias. External quantum efficiency is enhanced by light extraction from the injection side of the diode and the use of laterally overgrown material to provide a non-shading contact.

LED 100 overcomes the drawbacks of the Burrus and mesa diodes indicated above. For example, a main drawback of the Burrus LED is that the Burrus structure has a larger junction area than its light emitting area. This tends to introduce a parasitic capacitance which ultimately limits the useful operating speed of the device. This problem is overcome by LED 100 wherein the junction area 118 equals the useful light emitting area. Other difficulties that are overcome by the invention arise from the fact that Burrus diodes require electrical contacts to be made on opposite sides of the wafer. As shown in FIG. 5, the invention may be practiced with both contacts 106 and 108 on the same side. Thus the device or LED 100 is compatible with the fabrication of driving circuitry on the same substrate as the LED. The invention has the advantage, however, of optionally permitting one of the contacts 110 to be on the opposite side should that be desired.

LED 100 also overcomes disadvantages of the mesa structure. As with the Burrus diode, the junction area in the mesa diode is larger than the useful area due to the fact that the electrical contact blocks the light from as much as one third of the junction area. The LED 100 of this invention, however, uses laterally overgrown material upon which to make the electrical contact thus leaving the optical path free from obstruction. Furthermore, the exposed edge of the mesa structure does not allow for making contact with other devices on the same substrate by the usual process of depositing and patterning thin metal films. This drawback again is overcome with the LED of this invention.

FIG. 6 illustrates a variation of an LED in accordance with this invention. As shown therein, a dual-junction LED 120 is formed by utilizing a substrate 122 which may, for example, be a semiconductor of n-GaAs. An intermediate semiconductor layer 124 is formed on semiconductor substrate 122 with a junction 123 being therebetween. Junction 123 functions to sweep out carriers which do not emit light. The intermediate semiconductor layer 124 may be made of, for example, p-GaAs. A contact 128 made from Au-Zn is also formed as with the LED 100. In addition, contact 130 is provided made, for example, of Au-Ge-Ni. Contact 132, made of Au-Zn can be used to provide a reverse bias to junction 123. The top semiconductor layer 134 which is opposite in conductivity type to the intermediate layer 124, may be made of n-GaAs or n-(GaAl)As which is grown through vias in dielectric 126 as with the prior LED 100 to form a junction 133. FIG. 6 illustrates the light by the reference numeral 136.

As can be appreciated, the structure of this invention may thus be formed in a preferred embodiment by growing gallium aluminum arsenide compound from a saturated metal solution onto a dielectric-coated substrate of opposite conductivity type in which vias have been formed to allow for nucleation and growth. The cathode contact is made to the laterally overgrown material using an alloy of, for example, gold, germanium and nickel. The anode connection may be made to the top surface through a window in the dielectric material or to the back surface (which may be a silicon device in the case of Si:GaAs integration) using a gold-zinc alloy.

The invention may be used by itself for fiber optic communication applications. The quasi-planar structure allows the device to be fabricated along with other components on the same substrate so that integrated circuits may operate at higher speeds and greater reliability than electrical connections presently known. Variations of the invention include the possibility of increasing the speed of the device by using other types of semiconducting materials such as InP. Speed may also be increased by the use of a reverse-biased junction in series with the light-emitting junction in a structure similar to a heterojunction bipolar transistor as described in LED 120.

What is claimed:

1. A high speed heterojunction light-emitting diode comprising a structure which includes a substrate made from a short minority carrier lifetime semiconductor material having a conductivity, said structure having a top surface and a back surface, a dielectric coating on said top surface, vias in said dielectric coating, a top semiconductor layer on said dielectric coating contacting said substrate through one of said vias, said semiconductor layer being of opposite conductivity to said substrate, a heterojunction area in the area where said semiconductor layer contacts said substrate, and a pair of contacts comprising an anode contact and a cathode contact on said structure.

2. The diode of claim 1 wherein said semiconductor layer is epitaxially grown through said vias, and said heterojunction area is equal to the useful light emitting area of said diode.

3. The diode of claim 2 wherein one of said contacts is made to a lateral portion of overgrown material on said top surface.

4. The diode of claim 3 wherein both of said contacts are on said top surface whereby said structure is compatible with planar processing techniques.

5. The diode of claim 4 wherein the other of said contacts is made through a window in said dielectric coating.

6. The diode of claim 3 wherein the other of said contacts is on said back surface.

7. The diode of claim 2 wherein said semiconductor layer is a gallium aluminum arsenide alloy grown from a saturated metal solution, and said substrate being heavily doped with a minority carrier lifetime of ten or less nanoseconds.

8. The diode of claim 7 wherein said cathode contact is made to the laterally overgrown material using an alloy of gold, germanium and nickel, and said anode contact is made from a gold-zinc alloy.

9. A dual junction high speed heterojunction light-emitting diode comprising a structure which includes a substrate made from a short minority carrier lifetime material having a conductivity, said structure having a top surface and a back surface, an intermediate semiconductor layer on said top surface and of opposite conductivity to said substrate, an intermediate heterojunction area at the area where said intermediate semiconductor layer contacts said substrate, a dielectric coating on said intermediate semiconductor layer, vias in said dielectric coating, a top semiconductor layer on said dielectric coating contacting said intermediate semiconductor layer through one of said vias, said top semiconductor layer being of opposite conductivity to said intermediate semiconductor layer, a top heterojunction area in the area where said top semiconductor layer contacts said intermediate semiconductor layer, and a pair of contacts comprising an anode contact, a cathode contact on said structure and a contact on said substrate.

10. The diode of claim 9 wherein said top semiconductor layer is epitaxially grown through said vias, and said top heterojunction area is equal to the useful light emitting area of said diode.

11. The diode of claim 10 wherein one of said contacts is made to laterally overgrown material on said top surface.

12. The diode of claim 11 wherein two of said contacts are on said top surface whereby said structure is compatible with planar processing techniques.

13. The diode of claim 12 wherein the second of said contacts is made through a window in said dielectric coating.

14. The diode of claim 11 wherein the second of said contacts is on said back surface.

15. The diode of claim 11 where the third contact is made to said substrate.

16. The diode of claim 10 wherein said top semiconductor layer is a gallium aluminum aresenide alloy grown from a saturated metal solution, and said intermediate semiconductor layer being heavily doped with a minority carrier lifetime of ten or less nanoseconds.

17. The diode of claim 15 wherein said cathode contact is made to the laterally overgrown material and said substrate using an alloy of gold, germanium and nickel, and said anode contact is made from a gold-zinc alloy.

* * * * *